(12) United States Patent
Ando (10) Patent No.: US 12,374,736 B2
(45) Date of Patent: Jul. 29, 2025

(54) HEAT RADIATION STRUCTURE, AND BATTERY PROVIDED WITH SAME

(71) Applicant: SHIN-ETSU POLYMER CO., LTD., Tokyo (JP)

(72) Inventor: Hitoshi Ando, Tokyo (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 502 days.

(21) Appl. No.: 17/999,401

(22) PCT Filed: May 7, 2021

(86) PCT No.: PCT/JP2021/017465
§ 371 (c)(1),
(2) Date: Nov. 21, 2022

(87) PCT Pub. No.: WO2021/241161
PCT Pub. Date: Dec. 2, 2021

(65) Prior Publication Data
US 2023/0238604 A1    Jul. 27, 2023

(30) Foreign Application Priority Data
May 28, 2020    (JP) ................................. 2020-092967

(51) Int. Cl.
*H01M 10/6554* (2014.01)
*H01M 10/613* (2014.01)
(Continued)

(52) U.S. Cl.
CPC ..... *H01M 10/6554* (2015.04); *H01M 10/613* (2015.04); *H01M 10/653* (2015.04);
(Continued)

(58) Field of Classification Search
CPC ................................................ H01M 10/6554
See application file for complete search history.

(56) References Cited

U.S. PATENT DOCUMENTS

2017/0263987 A1* 9/2017 Kopp ................ H01M 10/6554
2018/0168069 A1* 6/2018 Wei ..................... H05K 7/20336

FOREIGN PATENT DOCUMENTS

JP          2008243999 A     10/2008
WO    WO-2019082752 A1 *  5/2019  ............. B32B 25/00

OTHER PUBLICATIONS

International Search Report in PCT/JP2021/017465, mailed Jul. 6, 2021. 6pp.
Written Opinion in PCT/JP2021/017465, mailed Jul. 6, 2021. 3pp.

* cited by examiner

*Primary Examiner* — Brian R Ohara
(74) *Attorney, Agent, or Firm* — HAUPTMAN HAM, LLP (57) ABSTRACT

A heat dissipation structure including a plurality of heat dissipating members, and a support plate for supporting the heat dissipating members. Each of the heat dissipating members includes a plurality of cushion members each having a hollow or a solid shape, and a heat conduction sheet covering an outer surface of the cushion members. The support plate includes a plurality of grooves for supporting the heat dissipating members in a direction orthogonal to a longitudinal direction of the heat dissipating members. Each of the grooves is a curved recess portion formed in a thickness direction, opened to the side of the heat dissipating member, formed to have a radius of curvature larger than a radius of curvature of the heat dissipating member, and to have a depth smaller than a circular conversion diameter of the heat dissipating member, and a battery provided with the heat dissipating structure.

10 Claims, 9 Drawing Sheets

(51) Int. Cl.
*H01M 10/653* (2014.01)
*H01M 10/6551* (2014.01)
*H01M 10/6556* (2014.01)
*H01M 50/211* (2021.01)
*H05K 7/20* (2006.01)

(52) U.S. Cl.
CPC ... *H01M 10/6551* (2015.04); *H01M 10/6556* (2015.04); *H01M 50/211* (2021.01); *H05K 7/20218* (2013.01)

HEAT RADIATION STRUCTURE, AND BATTERY PROVIDED WITH SAME

CROSS REFERENCE

The present application is a National Phase of International Application No. PCT/JP2021/017465 filed May 7, 2021, and claims priority from Japanese patent application JP2020-092967 filed on May 28, 2020, the content of which is hereby incorporated by reference into this application. Contents of patents, patent applications, and documents cited herein are incorporated by reference into this application.

TECHNICAL FIELD

The present invention relates to a heat dissipation structure and a battery provided with the same.

BACKGROUND ART

A control system of automobiles, aircraft, ships or electronic devices for home use or business use has become further highly accurate and complicated, and correspondingly the integration of small electronic components on a circuit board has been increasingly densified. As a result, it is strongly requested to solve the trouble or the shortening of service life of the electronic components owing to heat generated in the periphery of the circuit board.

Conventionally, rapid heat dissipation from the circuit board has been implemented by using the material excellent in heat dissipation for forming the circuit board itself, mounting the heat sink, or driving a cooling fan either in an individual or complex manner. Of these, the method of forming the circuit board itself using the material excellent in heat dissipation, for example, diamond, aluminum nitride (AlN), cubic boron nitride (cBN), or the like extremely increases the cost of the circuit board. Additionally, placement of the cooling fan causes problems of malfunction of a fan as the rotator, need of maintenance for preventing the trouble, and difficulty in securing a mount space. Meanwhile, the heat dissipating fin is a simple member capable of increasing a surface area by forming many columnar or flat plate-like projections made of high heat conduction metal (for example, aluminum) to further enhance heat dissipation. The heat dissipating fin has been generally used as the heat dissipating component (see Patent Literature 1).

Recently, for the purpose of reducing a load to global environment, conversion of conventional gasoline-powered vehicles or diesel vehicles into electric automobiles has become a global upward trend. Particularly, the market for electric automobiles has been expanding in China as well as European countries such as France, Netherlands, and Germany. To encourage widespread adoption of electric automobiles, construction of more charging stands is required in addition to development of high-performance batteries. Particularly, technological development for enhancing a charging-discharging function of a lithium automobile battery is an important issue. It is well known that automobile batteries cannot sufficiently exert charging-discharging functions under a high temperature of 60° C. or higher. Therefore, as with the aforementioned circuit board, heat dissipating enhancement is regarded as an important issue for the battery.

In order to implement rapid heat dissipation from the battery, the structure described below has been employed. The structure is attained by disposing a water-cooling pipe in a housing formed of metal excellent in heat conductivity such as aluminum. Many battery cells are disposed in the housing, and a rubber sheet with adhesiveness is interposed between the battery cells and a bottom surface of the housing. The above-structured battery allows the battery cells to conduct heat to the housing via the rubber sheet, and to effectively remove heat through water cooling.

CITATION LIST

Patent Literature

Patent Literature 1: Japanese Patent Laid-Open No. 2008-243999

SUMMARY OF INVENTION

Technical Problem

The heat conductivity of the rubber sheet used for the generally employed battery is lower than that of aluminum or graphite. Therefore, it is difficult to effectively transfer heat from the battery cells to the housing. The use of a spacer of graphite or the like to be interposed in place of the rubber sheet may be considered. However, as the lower surfaces of the battery cells are not flat because of stepped portions, gaps are formed between the battery cells and the spacer, resulting in deteriorated heat conduction efficiency. As described in the example, the battery cells can take various forms (including uneven or non-smooth surface state such as the stepped portion), and therefore the demand for adaptability to the various forms of the battery cells, and achievement of high heat conduction efficiency has been increasing. To realize high heat conduction efficiency, it is preferable to radiate heat uniformly from the respective battery cells so that each temperature of the battery cells becomes uniform. Furthermore, the heat dissipation structure has been required to restore its shape nearly to the original state after removing the battery cells, and also to improve its productivity. This applies not only to the battery cell but also to other heat sources like the circuit board, the electronic component, and the electronic device body. Meeting those requirements leads to attainment of the sustainable development as the goal of the applicant, aiming at "securing access to sustainable modern energy services, reliable and yet inexpensive for every consumer".

In light of the foregoing circumstances, it is an object of the present invention to provide a heat dissipation structure configured to be adaptable to various forms of heat sources, elastically deformable, excellent in heat dissipating efficiency, enhance uniformization of heat dissipation in each of the multiple heat sources, and improve the productivity, and a battery provided with the heat dissipation structure.

Solution to Problem (1) To achieve the object, a heat dissipation structure according to an embodiment comprises a plurality of heat dissipating members for enhancing heat dissipation from a heat source, and a support plate for supporting the heat dissipating members. Each of the heat dissipating members comprises a plurality of cushion members each comprising a hollow or a solid shape, and a heat conduction sheet for conducting heat from the heat source, which covers an outer surface of the cushion member. The support plate comprises a plurality of grooves for supporting the heat dissipating members in a direction orthogonal to a longitudinal direction of the heat dissipating members. Each of the grooves is a curved recess portion formed in a thickness direction to be opened to the side of the heat dissipating member. The groove is formed to have a radius of curvature larger than a radius of curvature of the heat dissipating member, and to have a depth smaller than a circular conversion diameter of the heat dissipating member.

(2) In the heat dissipation structure according to another embodiment, preferably, the support plate may comprise at least one or more flow passages for passage of a cooling medium in the longitudinal direction.

(3) In the heat dissipation structure according to another embodiment, preferably, the flow passage may be a through passage penetrating through the support plate.

(4) In the heat dissipation structure according to another embodiment, preferably, the support plate may be a metal plate-like member.

(5) In the heat dissipation structure according to another embodiment, preferably, the heat dissipating member may be a cylindrical member comprising a hollow portion extending along the longitudinal direction.

(6) In the heat dissipation structure according to another embodiment, preferably, the cushion member may be a cylindrically shaped cushion member comprising the hollow portion extending along the longitudinal direction, and the heat conduction sheet may be spirally wound around the outer surface of the cylindrically shaped cushion member.

(7) In the heat dissipation structure according to another embodiment, preferably, the heat conduction sheet and the cushion member may be formed to integrally advance spirally in one direction.

(8) In the heat dissipation structure according to another embodiment, preferably, a heat conduction oil may be applied to a surface of the heat conduction sheet for enhancing heat conductivity to the surface from the heat source in contact with the surface.

(9) In the heat dissipation structure according to another embodiment, preferably, the heat conduction oil may include a silicone oil, and a heat conduction filler that exhibits higher heat conductivity than the silicone oil and contains at least one of metal, ceramics, and carbon.

(10) A battery according to one embodiment comprises one or more battery cells each as a heat source in a housing. The heat dissipation structure of any one of the heat dissipation members as described above is disposed between the battery cell and the housing.

Advantageous Effect of Invention

The present invention provides the heat dissipation structure configured to be adaptable to various forms of heat sources, elastically deformable, excellent in heat dissipating efficiency, enhance uniformization of heat dissipation in each of the multiple heat sources, and improve the productivity, and the battery provided with the heat dissipation structure.

DESCRIPTION OF EMBODIMENTS

Embodiments of the present invention are described referring to the drawings. Each embodiment described herein does not limit the invention according to the scope of the claims, and all elements described in each embodiment, and all combinations thereof are not necessarily essential for solution described herein.

1. Heat Dissipation Structure

First Embodiment

Figure 1:
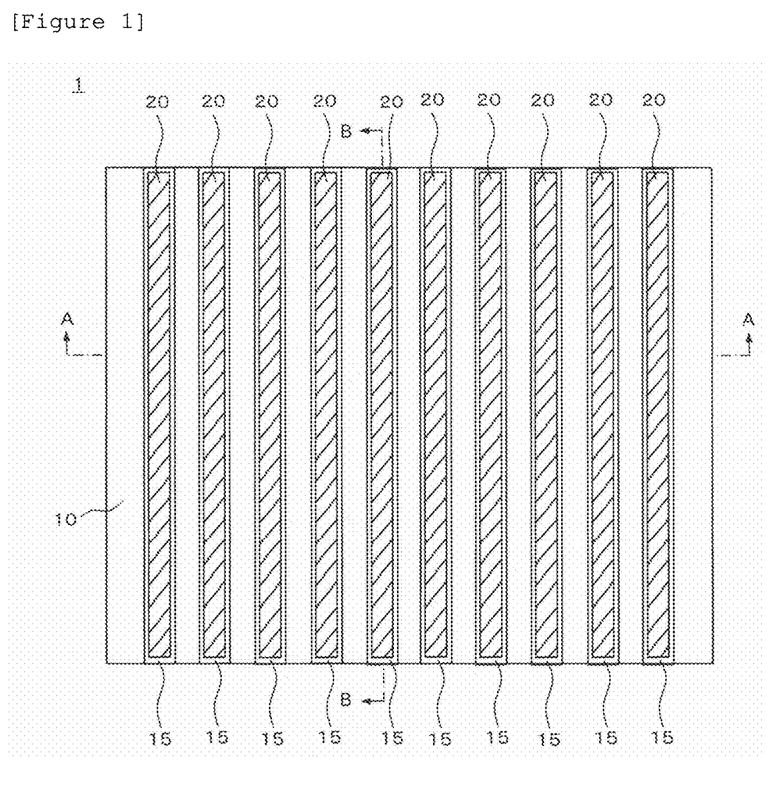
FIG. 1 is a plan view of a heat dissipation structure according to a first embodiment.
Figure 2:
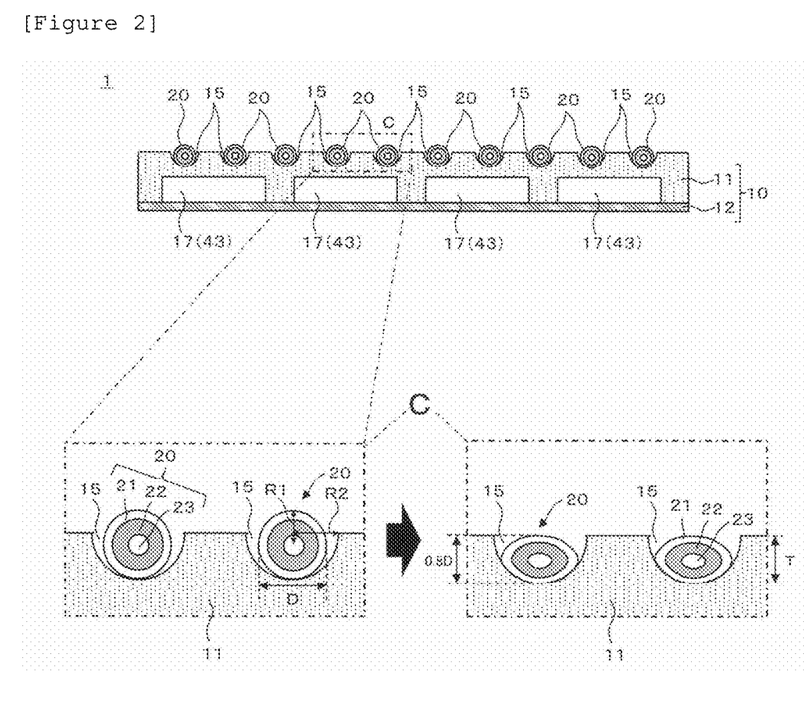
FIG. 2 shows a sectional view taken along line A-A of FIG. 1, and an enlarged view of a part C in the sectional view.
Figure 3:
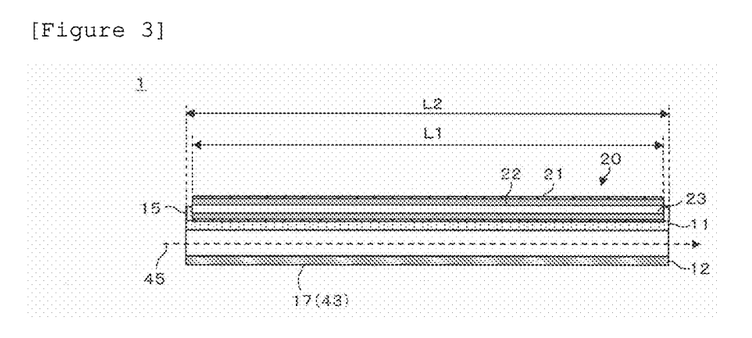
FIG. 3 is a sectional view taken along line B-B of FIG. 1.

FIG. 1 is a plan view of a heat dissipation structure according to a first embodiment. FIG. 2 shows a sectional view taken along line A-A of FIG. 1, and an enlarged view of a part C in the sectional view. FIG. 3 is a sectional view taken along line B-B of FIG. 1. In this embodiment, it is assumed that the heat source is placed at the upper part in the plane of FIGS. 2 and 3. This applies to the subsequent embodiments. Referring to FIG. 1, the heat dissipation structure 1 comprises ten heat dissipating members 20. The number of the heat dissipating members 20, however, is not particularly limited to the one as described above. This applies to the subsequent embodiments.

(1) Outline of Structure

The heat dissipation structure 1 according to the first embodiment is a member which comprises multiple heat dissipating members 20 for enhancing heat dissipation from a heat source, and a support plate 10 for supporting the heat dissipating members 20. The heat dissipating member 20 comprises multiple cushion members 22 each comprising a hollow or a solid shape, and a heat conduction sheet 21 for conducting heat from the heat source, and covering an outer surface of the cushion member 22. The support plate 10 comprises multiple grooves 15 for supporting the heat dissipating members 20 in a direction orthogonal to a longitudinal direction of the heat dissipating members 20 (left-right direction of FIG. 1). Each of the grooves 15 is a curved recess portion formed in a thickness direction, opened to the side of the heat dissipating member 20. The groove 15 is formed to have a radius of curvature R2 larger than a radius of curvature R1 of the heat dissipating member 20, and to have a depth T smaller than a circular conversion diameter D of the heat dissipating member 20 (see FIG. 2). The heat dissipating member 20 may be referred to as a "heat conduction member" or a "heat transfer member". The term "radius of curvature" refers to a radius of a perfect circle having its bend most approximate to that of a curve of the cross section derived from cutting the heat dissipating member 20 and the groove 15 perpendicularly to the longitudinal direction. The term "circular conversion diameter" refers to a diameter of a perfect circle with the same area as that of the cross section of the heat dissipating member 20 to be cut perpendicularly to the longitudinal direction. Those terms apply to the subsequent embodiments.

(2) Heat Conduction Sheet

Preferably, the heat conduction sheet 21 is spirally winding along an advancing direction. Arbitrary material may be contained in the heat conduction sheet 21. The heat conduction sheet 21, however, preferably contains carbon, and more preferably contains 90 mass % carbon. For example, a graphite film produced by firing the resin may be used for the heat conduction sheet 21. The heat conduction sheet 21 may be the sheet containing carbon and resin. In this case, the resin may be replaced with a synthetic fiber. In the circumstance, aramid fiber is suitably usable as the resin. The "carbon" described herein may be widely interpreted to contain an arbitrary structure composed of carbon (C) such as graphite, carbon black with lower crystallinity than graphite, diamond, and diamond-like carbon having a similar structure to diamond. In this embodiment, the heat conduction sheet 21 may be a thin sheet obtained by curing a material having graphite fiber or carbon particles compounded and dispersed in resin. The heat conduction sheet 21 may be the carbon fiber formed through meshed weaving, mixed spinning, or mixed knitting. Various types of fillers like the graphite fiber, the carbon particles, or the carbon fiber may be considered to fall under the concept of the carbon filler.

Assuming that the heat conduction sheet 21 contains carbon and resin, the resin may or may not exceed 50 mass % to the total mass of the heat conduction sheet 21. That is, the resin may or may not be used as a main material for forming the heat conduction sheet 21 as long as the resultant heat conduction is not seriously affected. The thermoplastic resin may be suitably used as the resin, for example. It is preferable to use the resin with high melting point at which it may be kept unmelted in heat conduction from the heat source, for example, polyphenylene sulfide (PPS), polyetheretherketone (PEEK), polyamide imide (PAI), and aromatic polyamide (aramid fiber). Before formation of the heat conduction sheet 21, the resin is dispersed in gaps in the carbon filler in the form of particle or fiber, for example. The heat conduction sheet 21 may be formed to have $Al_2O_3$, AlN, or diamond dispersed as the filler for enhancing heat conduction besides the carbon filler, resin, and the like. In place of the resin, elastomer more flexible than the resin may be used. The heat conduction sheet 21 may be formed as the sheet that contains metal and/or ceramics in place of or together with carbon. It is possible to selectively use the metal with relatively high heat conductivity such as aluminum, copper, and an alloy containing at least one of those metals. It is possible to selectively use ceramics with relatively high heat conductivity such as $Al_2O_3$, AlN, cBN, and hBN.

The heat conduction sheet 21 may or may not be excellent in electrical conductivity. Preferably, the heat conductivity of the heat conduction sheet 21 is equal to or higher than 10 W/mK. In the embodiment, the heat conduction sheet 21 is preferably the graphite film formed of the material excellent in heat conductivity and electrical conductivity. Preferably, the heat conduction sheet 21 exhibits sufficient curving property (or bending property). Although the thickness of the sheet is not limited to the specific value, it is preferable to use a sheet with a thickness ranging from 0.02 to 3 mm, and more preferably, ranging from 0.03 to 0.5 mm. As the thickness increases, the heat conductivity of the heat conduction sheet 21 is lowered in the thickness direction. However, since heat transmission quantity becomes large as increase in the thickness, it is preferable to determine the thickness by considering the balance among properties of the sheet such as strength, flexibility, and heat conductivity.

(3) Cushion Member

The cushion member 22 has essential functions of deformability and restorability. The restorability is determined by elastic deformation capability. The deformability is a necessary property for following the shape of the heat source. Particularly, the battery cell in an easily deformable package that houses a semisolid product such as lithium ion battery, a content having a liquid property, and the like is likely to have its design dimension indeterminable, or its dimensional accuracy hardly improved. Therefore, it is important to secure the restorability to retain the deformability and the follow-up property of the cushion member 22.

In this embodiment, the cushion member 22 is cylindrical, and comprises a hollow portion 23 extending in a longitudinal direction of the heat dissipating member 20. Although the heat source in contact with the heat conduction sheet 21 is not flat, the cushion member 22 improves the contact between the heat conduction sheet 21 and the heat source. The hollow portion 23 makes the cushion member 22 easily deformable, contributes to weight reduction in the heat dissipation structure 1, and has a function of enhancing the contact between the heat conduction sheet 21 and the heat source. The cushion member 22 has a function as a protective member that prevents the heat conduction sheet 21 from being damaged due to the load applied thereto. In this embodiment, the cushion member 22 exhibits the heat conductivity lower than that of the heat conduction sheet 21. In this embodiment, the hollow portion 23 is formed to have a circular cross section. The cross section of the hollow portion 23 is not limited to the circular shape, but may have a polygonal shape, an elliptical shape, a semicircular shape, and a substantially polygonal shape having rounded vertexes, for example. The hollow portion 23 may be composed of multiple hollow portions, for example, two hollow portions each having a semicircular cross section as a result of dividing the circular cross section into two upper-lower or left-right sections. The cushion member 22 may be formed into a solid structure with no hollow portion 23.

The cushion member 22 is preferably formed to contain thermosetting elastomer such as silicone rubber, urethane rubber, isoprene rubber, ethylene-propylene rubber, natural rubber, ethylene-propylene-diene rubber, nitrile rubber (NBR), or styrene-butadiene rubber (SBR); urethane-based, ester-based, styrene-based, olefin-based, butadiene-based, or fluorine-based thermoplastic elastomer; or composite thereof. Preferably, the cushion member 22 is formed of a material with high heat resistance that allows retention of formation of the heat conduction sheet 21 without being molten or decomposed by the heat connected through the heat conduction sheet 21. In this embodiment, more preferably, the cushion member 22 is formed of a material obtained by impregnating silicone into urethane-based elastomer, or silicone rubber. The cushion member 22 may be formed by dispersing the filler represented by, for example, particles of $Al_2O_3$, AlN, cBN, hBN, or diamond into rubber to enhance heat conductivity as high as possible. The cushion member 22 may or may not be formed as the member containing bubbles. The "cushion member" represents an elastically deformable member with high flexibility, and capable of being in tight contact with a surface of the heat source, and can be replaced with a term "rubber elastic structure" in the context herein. Furthermore, as a modification of the cushion member 22, metal may be used in place of the rubber elastic structure. For example, the cushion member 22 can be constituted by spring steel. Furthermore, as the cushion member 22, a coil spring can be disposed. Additionally, spirally wound metal may be used as the spring steel, and disposed on the annular back surface of the heat conduction sheet 21 as the cushion member. The cushion member 22 can be constituted by a sponge formed of such material as resin and rubber, or a solid material (non-porous structure unlike the sponge).

(4) Support Plate

Preferably, a support plate 10 is a metal plate-like member. More preferably, the support plate 10 is composed of a material with relatively high heat conductivity, for example, aluminum, copper, and an alloy which contains at least one of those materials. The support plate 10 may contain resin and/or ceramics, or may be composed of resin and/or ceramics in place of the metal. The material similar to the one for forming the preceding heat conduction sheet 21 may be used for the resin and ceramics.

Preferably, the support plate 10 comprises a support base plate 11 comprising multiple grooves 15 for supporting the heat dissipating members 20, and a bottom plate 12. Preferably, the support base plate 11 comprises the grooves 15 arranged in the surface that faces the heat source along the direction orthogonal to the longitudinal direction of the heat dissipating members 20 (left-right direction of FIG. 2), and multiple notches 18 arranged in the surface that faces the bottom plate 12 along the direction orthogonal to the longitudinal direction (see FIG. 7 to be described later). The groove 15 is a curved recess portion formed in the thickness direction (up-down direction of FIG. 2) while being opened to the side of the heat dissipating member 20 (heat source side). Preferably, the notch 18 is a groove cut into a rectangular shape in the thickness direction (up-down direction of FIG. 2) while being opened to the side of the bottom plate 12. Preferably, the notch 18 is formed to penetrate in the longitudinal direction (the direction of the depth of FIG. 2). Preferably, the bottom plate 12 is a flat plate-like member to be bonded to the surface of the support base plate 11, in which the notches 18 are formed. The support plate 10 comprises through passages 17 each penetrating through the support plate 10 in the longitudinal direction, which are formed by the notch 18 and the bottom plate 12 as a result of bonding of the support base plate 11 to the bottom plate 12. The through passage 17 is a member serving as a flow passage 43 for passage of a cooling medium 45 in the longitudinal direction. The size and shape of the notch 18 are not particularly limited as long as it is sized and shaped to allow passage of at least the cooling medium 45. The number of notches 18 formed in the heat dissipation structure 1 is not particularly limited. The support plate 10 may be formed by integrally molding the support base plate 11 and the bottom plate 12. The cooling medium 45 may be replaced with the term "cooling member" or "coolant". The cooling medium 45 is interpreted as the one including liquid nitrogen, and the organic solvent such as ethanol without being limited to the cooling water. The cooling medium 45 used in such circumstance as cooling is not limited to liquid, but may be in the form of gas or solid. The term "support plate" refers to the plate member for cooling the heat source through heat conduction from the heat dissipating members 20 to the cooling medium. Accordingly, the support plate may be replaced with a term "cooling plate".

Upon reception of pressure force from the heat source, the heat dissipating members 20 are vertically crushed, that is, in the direction from the heat source to the flow passage 43 for passage of the cooling medium 45. If the heat dissipating members 20 are hardly crushed, there is a risk of deteriorating adhesiveness between the heat conduction sheet 21 and the heat sources, etc. Such risk may be reduced by setting the thickness of the heat dissipating member 20 in the up-down direction to at least 80% of the cross-section diameter of the heat dissipating member 20 (=circular conversion diameter: D). The groove 15 is formed to have its depth T smaller than the circular conversion diameter D of the heat dissipating member 20. Preferably, the groove 15 is formed to have its depth T set to at least 80% (0.8 D) of the diameter of the heat dissipating member 20 or smaller (see enlarged view of the part C in FIG. 2). In this embodiment, the groove 15 is formed to have its depth T set to 80% (0.8 D) of the diameter of the heat dissipating member 20. The depth T of the groove 15 refers to the length from the surface of the support base plate 11, which faces the heat source to the bottom of the groove 15. The resultant groove 15 secures the contact between the heat source and the heat dissipating member 20, and allows compression of the heat dissipating member 20 to reach at least the appropriate thickness under the compression in the up-down direction as described above.

The groove 15 is formed to have its radius of curvature R2 larger than a radius of curvature R1 (=0.5 D) of the heat dissipating member 20. The groove 15 may deform the heat dissipating member 20 into a substantially elliptical shape along the curved surface of the groove 15 when the heat dissipating member 20 is crushed under the pressing force applied from the heat source (see enlarged view of the part C in FIG. 2). Compared with the case where the radius of curvature R2 of the groove 15 is smaller than the radius of curvature R1 of the heat dissipating member 20, or the support plate 10 comprises no grooves 15, the heat dissipation structure 1 enlarges the contact area between the heat dissipating member 20 and the support plate 10 when the heat dissipating member 20 is crushed under the pressing force applied from the heat source. Preferably, the groove 15 has its longitudinal length L2 longer than the longitudinal length L1 of the heat dissipating member 20 (see FIG. 3). The structure allows the support plate 10 to securely support the heat dissipating member 20 even when the heat dissipating member 20 longitudinally expands/contracts under the pressing force applied from the heat source. However, the support plate 10 may be structured to have the longitudinal length L2 of the groove 15 equal to the longitudinal length L1 of the heat dissipating member 20. The number of grooves 15 formed in the heat dissipation structure 1 is not particularly limited as long as it is equal to or larger than at least the number of the heat dissipating members 20. For example, the number of grooves may be equal to or larger than the number of the heat dissipating members 20.

(5) Heat Conduction Oil

Preferably, the heat conduction oil contains silicone oil, and a heat conduction filler that exhibits higher heat conductivity than the silicone oil, and is composed of at least one of metal, ceramics, and carbon. The heat conduction sheet 21 comprises a gap (hole or recess portion) on a microscopic level. Normally, air existing in the gap may exert adverse influence on the heat conductivity. The heat conduction oil is filled in the gap to remove air to enhance heat conductivity of the heat conduction sheet 21.

The heat conduction oil is applied to the surface of the heat conduction sheet 21, specifically, at least the surface on which the heat source comes in contact with the heat conduction sheet 21. Herein, the "oil" of the heat conduction oil refers to a water-insoluble combustible substance in either liquid or semi-solid form at normal temperature (arbitrary temperature in the range from 20 to 25° C.). It is possible to use the term "grease" or "wax" in place of the term "oil". The heat conduction oil hardly becomes the obstacle to heat conduction upon heat transfer from the heat source to the heat conduction sheet 21. A hydrocarbon-based oil and the silicone oil may be used for forming the heat conduction oil. Preferably, the heat conduction oil contains the silicone oil, and the heat conduction filler that exhibits higher heat conductivity than the silicone oil, and is composed of at least one of metal, ceramics, and carbon.

Preferably, the silicone oil is composed of particles having siloxane bond of 2000 or less with linear chain structure. Silicone oils are broadly classified into straight silicone oils and modified silicone oils. The straight silicone oils include dimethyl silicone oil, methylphenyl silicone oil, and methyl hydrogen silicone oil. The modified silicone oils include reactive silicon oils and non-reactive silicone oils. The reactive silicone oils include various types, for example, amino modified type, epoxy modified type, carboxy modified type, carbinol modified type, methacryl modified type, mercapto modified type, phenol modified type, and the like. The non-reactive silicone oils include various types like polyether modified type, methylstyryl modified type, alkyl modified type, higher fatty acid ester modified type, hydrophilic specific modified type, higher fatty acid contained type, and fluorine modified type. Because of properties excellent in heat resistance, cold resistance, viscosity stability, and heat conductivity, the silicone oil is applied to the surface of the heat conduction sheet 21 to serve as the heat conduction oil especially suitable for intervening between the heat source and the heat conduction sheet 21.

Preferably, the heat conduction oil contains the heat conduction filler composed of at least one of metal, ceramics, and carbon besides the oil content. Gold, silver, copper, aluminum, beryllium, tungsten, and the like are exemplified as metal. Alumina, aluminum nitride, cubic boron nitride, hexagonal boron nitride, and the like are exemplified as ceramics. Diamond, graphite, diamond-like carbon, amorphous carbon, carbon nanotube, and the like are exemplified as carbon.

Preferably, the heat conduction oil intervenes between the heat conduction sheet 21 and the housing of the battery to be described later in addition to the intervention between the heat source and the heat conduction sheet 21. The heat conduction oil may be applied to the surface of the heat conduction sheet 21 entirely or partially. Application of the heat conduction oil to the heat conduction sheet 21 is not necessarily limited to the specific method. The heat conduction oil may be applied arbitrarily by, for example, atomization using the spray, application using the brush or the like, immersion of the heat conduction sheet 21 in the heat conduction oil, and the like. Preferably, the heat conduction oil is used as an element to be suitably added to the heat dissipation structure 1 or the battery to be described later rather than as the requisite element therefor. This applies to the subsequent embodiments.

The heat dissipation structure 1 is disposed on the support plate 10 along the direction orthogonal to the longitudinal direction in the state where the multiple heat dissipating members 20 are supported in the grooves 15. The groove 15 is the curved recess formed in the thickness direction while being opened to the side of the heat dissipating member 20. The groove is formed to have the radius of curvature R2 larger than the radius of curvature R1 of the heat dissipating member 20, and have the depth T smaller than the circular conversion diameter D of the heat dissipating member 20. The contact between the heat conduction sheet 21 and the lower ends may be improved even if lower ends of the multiple heat sources are not flat. To attain high heat conduction efficiency, it is desirable to make heat dissipation from each of many heat sources uniform so that each temperature of those heat sources becomes uniform. It is therefore preferable to arrange the multiple heat dissipating members 20 so that the number of the heat dissipating members 20 in contact with the respective heat sources becomes uniform. Preferably, the heat dissipation structure 1 is configured to set the number and positions of the grooves 15 formed in the support plate 10, and to set the number of the heat dissipating members 20 considering each size of those heat sources. The thus designed heat dissipation structure 1 positions the multiple heat dissipating members 20 on the support plate 10. The heat dissipation structure 1 allows improvement in uniformization of heat dissipation in each of those heat sources. The heat dissipation structure 1 allows positioning of the multiple heat dissipating members 20 arranged in the respective grooves 15 of the support plate 10 without connecting the heat dissipating members 20 using thread or the like. This may improve productivity. The heat dissipation structure 1 is configured to have each of the heat conduction sheets 21 spirally wound around the outer surface of the cushion member 22 to prevent excessive restriction on deformation of the cushion member 22. The multiple heat dissipating members 20 may not be arranged at equal intervals. In other words, the multiple grooves 15 may not be arranged at equal intervals.

Second Embodiment

A heat dissipation structure according to a second embodiment is described. Components common with those in the preceding embodiment are denoted by the same reference numerals, and redundant description is omitted.

Figure 4:
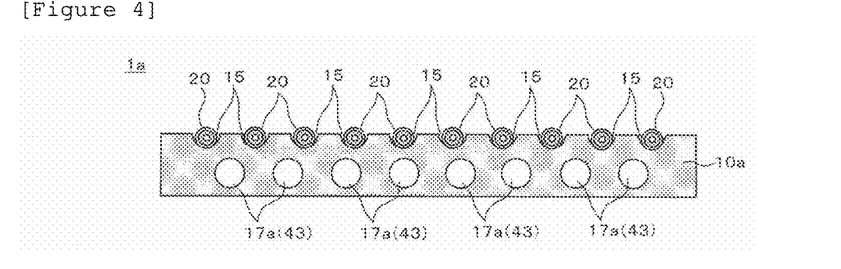
FIG. 4 illustrates a heat dissipation structure according to a second embodiment in the view similar to FIG. 2.

FIG. 4 illustrates the heat dissipation structure according to the second embodiment in the view similar to FIG. 2.

A heat dissipation structure 1a according to the second embodiment is configured similarly to the heat dissipation structure 1 according to the first embodiment except that a support plate 10a is provided instead of the support plate 10. As the heat dissipation structure 1a is configured similarly to the heat dissipation structure 1 according to the first embodiment except the support plate 10a, the detailed explanations are omitted.

Unlike the support plate 10 of the first embodiment, which is formed by bonding the support base plate 11 and the bottom plate 12, the support plate 10a is formed as an integrally molded member. The support plate 10a comprises multiple grooves 15 and through passages 17a. The grooves 15 are arranged in a surface of the support plate 10a, which faces the heat source along a direction orthogonal to a longitudinal direction (left-right direction of FIG. 4) of the heat dissipating members 20. The through passages 17a are arranged along the direction orthogonal to the longitudinal direction. The through passages 17a are formed while penetrating through the support plate 10a in the longitudinal direction (in the direction of the depth of FIG. 4). Similar to the through passage 17 of the first embodiment, the through passage 17a is a member serving as the flow passage 43 for passage of the cooling medium 45 in the longitudinal direction. In this embodiment, the through passage 17a is formed to have a circular cross section. The cross section of the through passage 17a is not limited to the circular shape, but may be a polygonal shape, an elliptical shape, a semicircular shape, and a substantially polygonal shape having rounded vertexes, for example. The through passage 17a may be composed of multiple through passages, for example, two through passages each having a semicircular cross section as a result of dividing the circular cross section into two upper-lower or left-right sections. The size and position of the through passage 17a are not particularly limited as long as it is sized and positioned to allow passage of at least the cooling medium 45. The number of the through passages 17a of the heat dissipation structure 1 is not particularly limited. The material for forming the support plate 10a and the structure of the groove 15 are similar to those of the support plate 10 of the first embodiment, and accordingly, detailed explanations are omitted. The configured heat dissipation structure 1a provides the similar effects to those derived from the first embodiment.

2. Method of Manufacturing Heat Dissipation Structure

An explanation is made about an example of a suitable method of manufacturing the heat dissipation structure 1 according to the first embodiment.

Figure 5A:
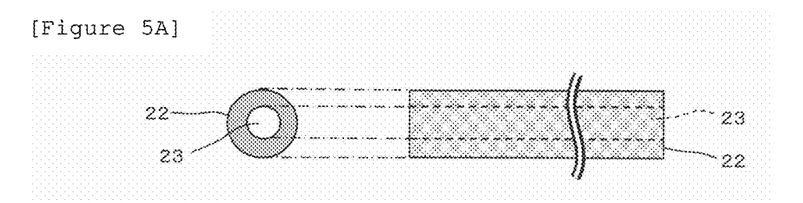
FIGS. 5A to 5C are explanatory views showing a process of forming a heat dissipating member constituting the heat dissipation structure.
Figure 5B:
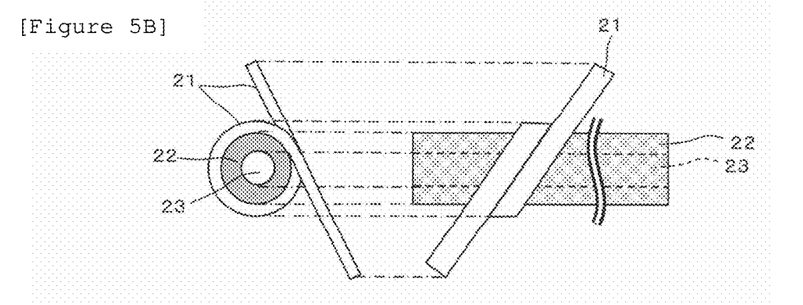
Figure 5C:
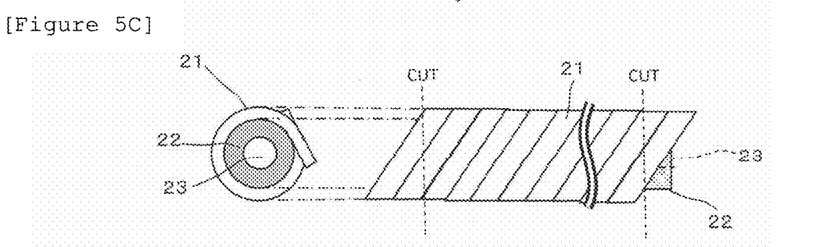
Figure 6D:
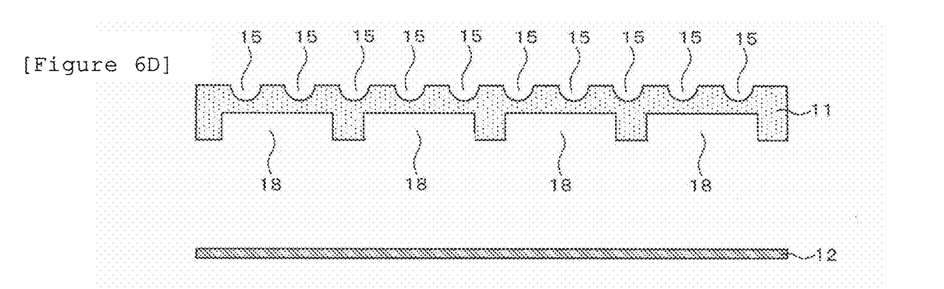
FIGS. 6D to 6F are explanatory views showing a process of forming a support plate constituting the heat dissipation structure according to the first embodiment.
Figure 6E:
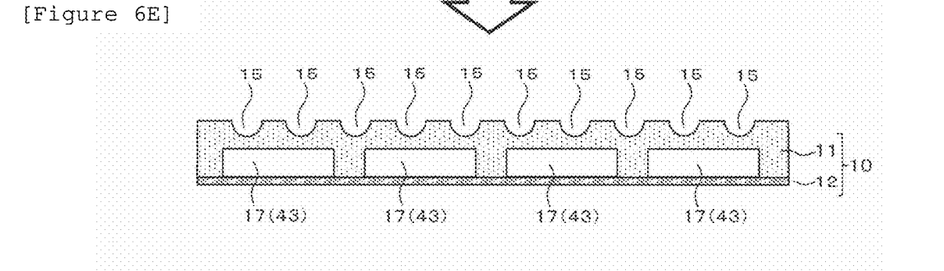
Figure 6F:
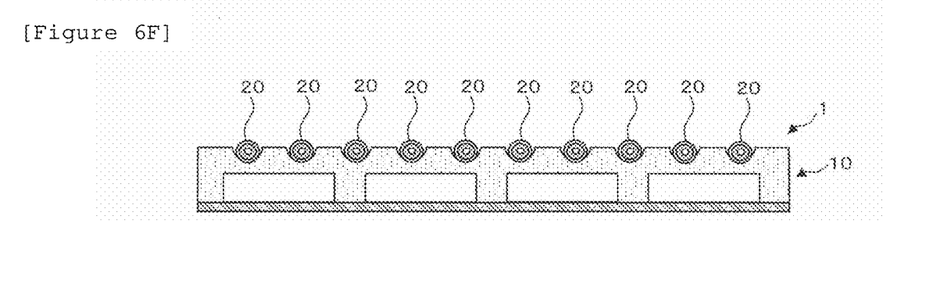

FIGS. 5A to 5C are explanatory views showing a process of forming the heat dissipating member constituting the heat dissipation structure. FIGS. 6D to 6F are explanatory views showing a process of forming the support plate constituting the heat dissipation structure according to the first embodiment.

An explanation is made about an example of a suitable method of forming the heat dissipating member 20 constituting the heat dissipation structure 1. The cushion member 22 comprising the hollow portion 23 is formed (see FIG. 5A). An adhesive agent is applied to an outer surface of the cushion member 22. The belt-like heat conduction sheet 21 is spirally wound around the outer surface of the cushion member 22. Portions of the heat conduction sheet 21, protruding from both ends of the cushion member 22 are cut. Alternatively, the protruding portions are cut together with the cushion member 22 (see FIGS. 5B and 5C). Finally, the heat conduction oil is applied to the surface of the heat conduction sheet 21. The cushion member 22 and the heat conduction sheet 21 may be fixed without intervening the adhesive agent therebetween. In this case, while the cushion member 22 is in the uncured state before it is completely cured, the belt-like heat conduction sheet 21 is wound around the outer surface of the cushion member 22. The cushion member 22 is then completely cured in heating so that the heat conduction sheet 21 is fixed to the outer surface of the cushion member 22.

Each timing for executing the process of cutting the heat conduction sheet 21 protruding from both sides of the cushion member 22, and the process of applying the heat conduction oil is arbitrarily set without being limited to the timing as described above. For example, the cutting process may be executed after execution of the application process.

An explanation is made about an example of a suitable method of forming the support plate 10 constituting the heat dissipation structure 1. The support base plate 11 and the bottom plate 12 are prepared (see FIG. 6D). Preferably, the support base plate 11 is formed by executing the process of cutting or extrusion molding. The support base plate 11 is formed so that the radius of curvature R2 of the groove 15 becomes larger than the radius of curvature R1 of the heat dissipating member 20, and the depth T of the groove 15 becomes smaller than the circular conversion diameter D of the heat dissipating member 20 (see FIG. 2). Then the support base plate 11 and the bottom plate 12 are bonded by welding to form the support plate 10 (see FIG. 6E). At this time, the support base plate 11 and the bottom plate 12 are bonded so that the notch 18 of the support base plate 11 and the bottom plate 12 face with each other.

The heat dissipation structure 1 is manufactured by placing the multiple heat dissipating members 20 formed through the method in the multiple grooves 15 of the support plate 10 formed through the method, respectively. In this case, preferably, the surface of the support plate 10, comprising the grooves 15 is fixed while being inclined to a horizontal plane so that the multiple heat dissipating members 20 roll on the inclined surface from the upstream side to be placed in the grooves 15, respectively. The heat dissipation structure 1 allows the multiple heat dissipating members 20 to be placed in the multiple grooves 15, respectively by rolling down on the inclinedly fixed surface of the support plate 10. This allows easy positioning of the multiple heat dissipating members 20 to the support plate 10 without connecting the heat dissipating members 20 using the thread or the like, resulting in improved productivity. The heat dissipation structure 1 may be configured to place the multiple heat dissipating members 20 in the support base plate 11 before bonding the support base plate 11 to the bottom plate 12. In this case, the heat dissipation structure 1 is manufactured by bonding the support base plate 11 comprising the multiple heat dissipating members 20 placed to the bottom plate 12.

The heat dissipation structure 1a according to the second embodiment is manufactured by placing the multiple heat dissipating members 20 formed through the method in the multiple grooves 15 of the support plate 10a formed by executing the process of cutting or extrusion molding. In this case, preferably, the surface of the support plate 10a, comprising the grooves 15 is fixed while being inclined to a horizontal plane so that the multiple heat dissipating members 20 roll on the inclined surface from the upstream side, and are placed in the grooves 15, respectively. Like the support plate 10, the support plate 10a is formed so that the radius of curvature R2 of the groove 15 becomes larger than the radius of curvature R1 of the heat dissipating member 20, and the depth T of the groove 15 becomes smaller than the circular conversion diameter D of the heat dissipation member 20. The manufactured heat dissipation structure 1a allows easy positioning of the multiple heat dissipating members 20 to the support plate 10a without connecting those heat dissipation members 20 using the thread or the like, resulting in improved productivities.

A preferred manufacturing method of the heat dissipation structure 1 as a modification is described. The heat dissipation structure according to the modification is manufactured through the same manufacturing method as that of the heat dissipation structure 1 except that the heat dissipating member 20 constituting the heat dissipation structure 1 is replaced with a heat dissipating member 20a. The detailed explanation, thus, is omitted. The preferred method of forming the heat dissipating member 20a will be described hereinafter.

Figure 7:
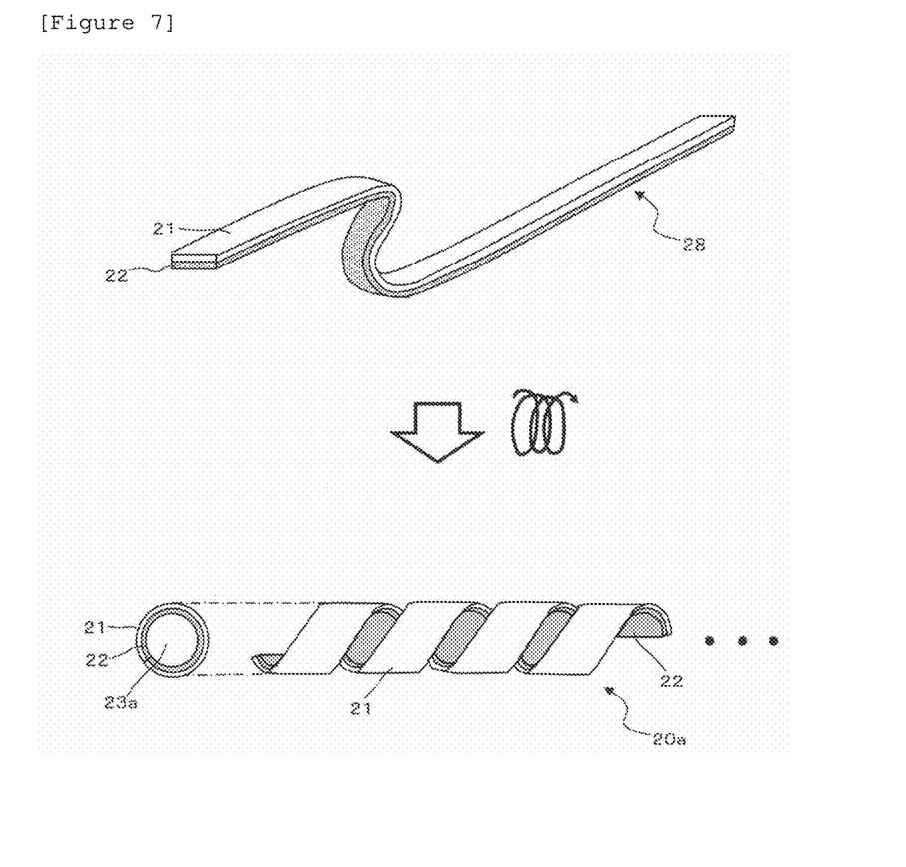
FIG. 7 is an explanatory view showing a preferred process of forming the heat dissipating member as a modification, which constitutes the heat dissipation structure.

FIG. 7 is an explanatory view showing a preferred process of forming the heat dissipating member as the modification, constituting the heat dissipation structure.

A belt-like laminated sheet 28 is formed. Upon formation of the belt-like laminated sheet 28, preferably, the heat conduction sheet 21 and the cushion member 22 are fixed using the adhesive agent. Then a long heat dissipating member 20a is formed by spirally winding the belt-like laminated sheet 28 along an advancing direction. The forming method without intervening the adhesive agent between the heat conduction sheet 21 and the cushion member 22 may be exemplified as follows. For example, the heat conduction sheet 21 is laminated onto the cushion member 22 in the uncured state before it is completely cured. The cushion member 22 is then heated to be completely cured.

After spirally winding the belt-like laminated sheet 28, both ends of the laminated sheet 28 may be cut for adjusting the shape. Finally, the heat conduction oil is applied to the surface of the heat conduction sheet 21. The heat dissipating member 20a comprises a hollow portion 23a penetrating therethrough in the longitudinal direction. Unlike the heat dissipating member 20 according to the preceding embodiment, the hollow portion 23a further extends toward the outer surface of the heat dissipating member 20a. The cushion member 22 is disposed on the inner side of the heat conduction sheet 21. The heat conduction sheet 21 and the cushion member 22 are formed to integrally advance spirally in one direction. The heat dissipating member 20a spirally extends across the entire length. Compared with the heat dissipating member 20 as described above, the heat dissipating member 20a spirally formed across the entire length is easily expandable in the longitudinal direction.

The heat dissipation structure 1a may be configured to replace the heat dissipating member 20 with the heat dissipating member 20a. In this case, the heat dissipation structure 1a may be manufactured by the similar method except the replacement of the heat dissipating member 20 with the heat dissipating member 20a.

3. Battery

A battery according to the embodiment is described.

Figure 8:
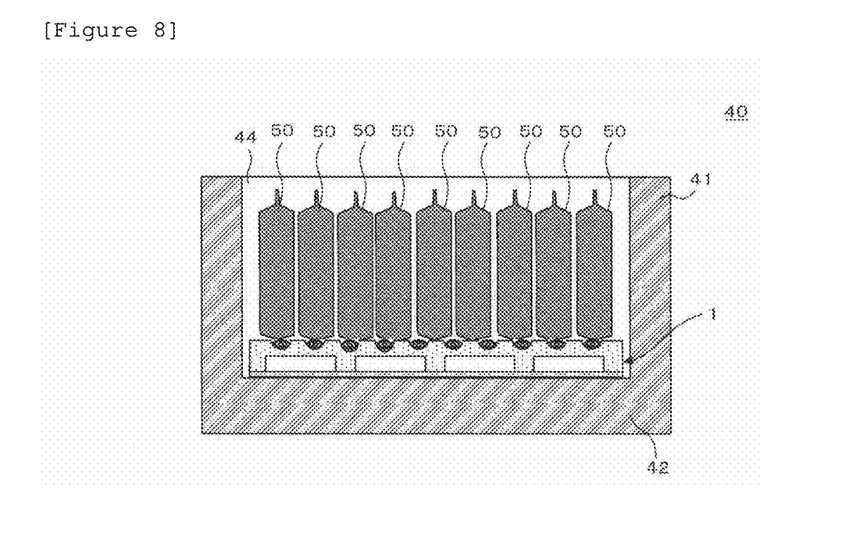
FIG. 8 is a longitudinal sectional view of a battery provided with the heat dissipation structure.

FIG. 8 is a longitudinal sectional view of a battery provided with the heat dissipation structure. The term "longitudinal sectional view" refers to a view as a result of vertically cutting the inside of the housing of the battery from the upper open surface to the bottom.

In this embodiment, a battery 40 is, for example, employed for an electric automobile, and comprises many battery cells 50. The battery 40 comprises a bottomed housing 41 comprising an opening on one side. The housing 41 is preferably formed of aluminum or aluminum base alloy. The battery cells 50 are disposed in an inner space 44 of the housing 41. Electrodes (not illustrated) project from the upper sides of the battery cells 50, respectively. Preferably, the battery cells 50 in the housing 41 are in tight contact with each other (not illustrated) by application of force in the compressing direction from both sides by utilizing screws or the like. The battery cells 50 are disposed to interpose the heat dissipation structure 1 with a bottom 42 of the housing 41. The flow passage 43 (through passage 17) is formed in the heat dissipation structure 1 at the side of the bottom 42 for passage of the cooling water as an example of the cooling medium 45.

The battery 40 comprises one or more battery cells 50 each as the heat source in the housing 41. The multiple heat dissipating members 20 provided in the heat dissipation structure 1 intervene between the battery cells 50 and the cooling medium 45. In the above-structured battery 40, the battery cells 50 conduct heat to the cooling medium 45 flowing through the flow passage 43 (through passage 17) via the heat dissipating members 20 for water cooling so that heat is effectively removed.

In the state where the battery cells 50 are set in the housing 41 (see FIG. 8), the heat dissipation structure 1 is compressed in its thickness direction between the battery cells 50 and the bottom 42. This allows heat from the battery cells 50 to be easily conducted to the heat conduction sheet 21, the support plate 10, the flow passage 43, and the cooling medium 45. The heat dissipation structure 1 is compressed by the battery cells 50 in the thickness direction until the length of the heat dissipating member 20 in the thickness direction corresponds to the depth T of the groove 15. In other words, the heat dissipating member 20 is compressed to such a degree that the length of the heat dissipating member 20 in the thickness direction does not become smaller than the depth T of the groove 15. Even if the heat dissipating members 20 are compressed by the battery cells 50 in the thickness direction (up-down direction), it is possible to prevent the heat dissipating members 20 from being compressed to make the length smaller than the depth T of the groove 15 in the contact state between the battery cells 50 and the support plate 10. Preferably, the depth T of the groove 15 has the thickness 80% of the circular conversion diameter D of the heat dissipating member 20 (0.8 D). The heat dissipation structure 1 comprises the support plate 10. This allows the operator to mount the heat dissipation structure 1 to the battery 40 while holding the support plate 10, resulting in improved operability. The battery 40 may comprise the heat dissipation structure 1a in place of the heat dissipation structure 1.

4. Other Embodiments

Preferred embodiments of the present invention have been described. The present invention, however, is not limited to these embodiments, but may be variously modified for implementation.

Figure 9:
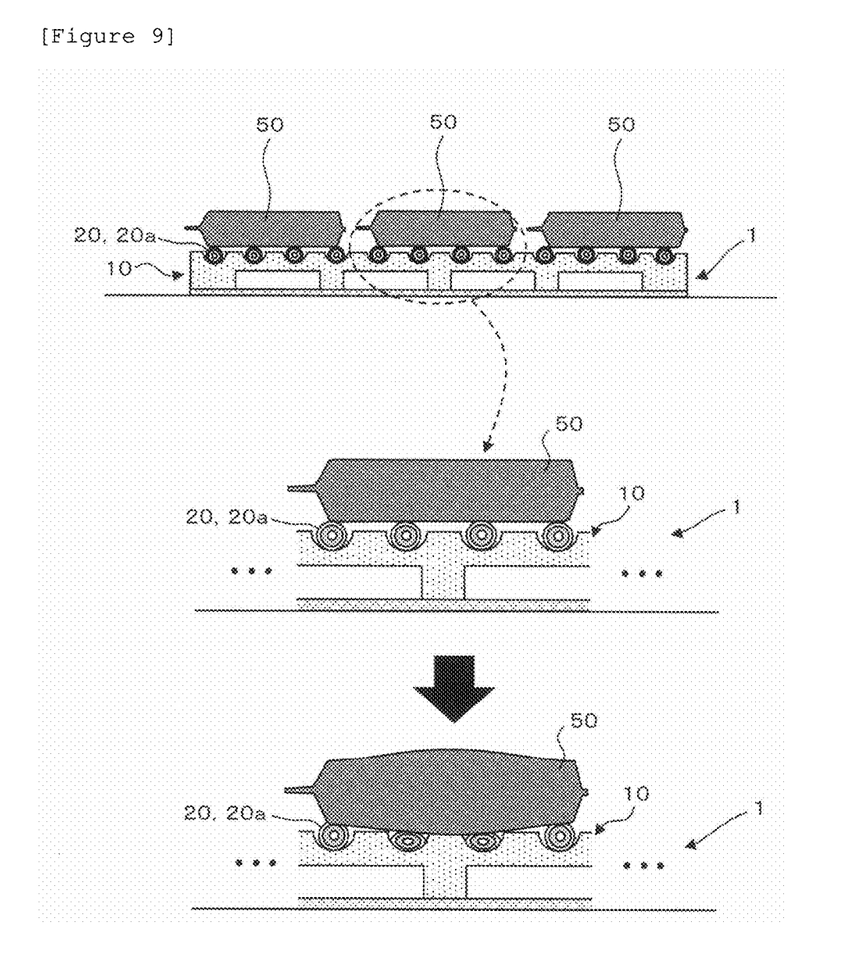
FIG. 9 shows a sectional view of battery cells placed transversely on the heat dissipation structure while having each side surface in contact therewith, a partially enlarged view, and a sectional view partially illustrating expansion of the battery cell in a charging-discharging state.

FIG. 9 shows a sectional view of battery cells placed transversely on the heat dissipation structure while having each side surface in contact therewith, a partially enlarged view, and a sectional view partially illustrating expansion of the battery cell in charging-discharging.

In the first embodiment, the battery cells 50 are vertically placed, having each lower end in contact with the heat dissipation structure 1. The battery cells 50 may be arbitrarily placed without being limited to the foregoing arrangement. As FIG. 9 shows, the battery cells 50 may be placed to allow the respective one side surfaces to come in contact with the respective heat dissipating members 20, 20a of the heat dissipation structure 1. The battery cell 50 has its temperature increased in the charging-discharging state. The use of the highly flexible material for forming the container of the battery cell 50 may expand especially the side surface of the battery cell 50. However, as shown in FIG. 9, the shape of each of the heat dissipating members 20, 20a constituting the heat dissipation structure 1 may be changed to conform to that of the outer surface of the battery cell 50.

This maintains high heat dissipation property even in the charging-discharging state. In the second embodiment, the battery cells 50 may be placed to allow the respective one side surfaces to come in contact with the respective heat dissipating members 20, 20a of the heat dissipation structure 1a.

The support plate 10, 10a may be configured to have one or more positioning holes which allow insertion of a positioning pin of the housing (bottom 42 or the like) of the battery 40. The positioning hole allows insertion of the positioning pin protruding from the bottom 42 of the battery 40. Insertion of the positioning pin through the positioning hole allows easy positioning between the battery 40 and the heat dissipation structure 1, 1a. The shape and position of each of the positioning hole and the positioning pin are not particularly limited.

In the above-described first embodiment, the support plate 10 comprises the support base plate 11 and the bottom plate 12. However, the support plate 10 does not have to comprise the bottom plate 12. In other words, the support plate 10 may be composed only of the support base plate 11. In this case, the support plate 10 is provided in the battery 40 so that the surface of the support plate 10 at the side where the notch 18 is formed is mounted on the bottom 42 of the housing 41. This makes it possible to form the flow passage 43 defined by the notch 18 and the bottom 42 for passage of the cooling medium 45 in the longitudinal direction.

The support plate 10, 10a may be arbitrarily formed without being particularly limited. For example, the support plate 10, 10a does not have to comprise the through passage 17, 17a as long as the multiple grooves 15 for supporting at least the multiple heat dissipating members 20, 20a are arranged along the direction orthogonal to the longitudinal direction of the heat dissipating members 20, 20a. In this case, preferably, the battery 40 is provided with one or more water cooling pipes 43 for passage of the cooling medium 45 to the bottom 42 of the housing 41.

The heat dissipating member 20 may not comprise the hollow portion 23 formed in the cushion member 22. In this case, the heat dissipating member 20 is structured by filling the hollow portion of the spiral heat conduction sheet 21 with the cushion member 22. Concerning the hollow portion to be formed either in the heat conduction sheet 21 or the cushion member 22, the hollow portion may not be formed in the cushion member 22 as long as it is formed at least by configuring the heat conduction sheet 21 into the winding structure.

The heat conduction sheet 21 of the heat dissipating member 20 may not be spirally wound along the advancing direction as long as it is shaped to cover the outer surface of at least the cushion member 22. The heat dissipating member 20 may be formed to cover, for example, the outer surface of the cushion member 22 using the single planar heat conduction sheet 21.

The width of the spiral cushion member 22 of the heat dissipating member 20a may not be the same as that of the heat conduction sheet 21. The width of the cushion member 22 may be larger or smaller than the width of the heat conduction sheet 21.

The heat source may be not only the battery cell 50 but also all heat generating components such as the circuit board and the electronic device body. For example, the heat source may be the electronic component such as the capacitor and the IC chip. Similarly, the cooling medium 45 may be an organic solvent, liquid nitrogen, cooling gas as well as cooling water. The heat dissipation structure 1, 1a may be provided for a structure other than the battery 40, for example, electronic devices, household electric appliances, power generation devices, and the like.

Multiple components in the embodiments may be arbitrarily combined except where some of those components cannot be combined with one another. For example, the battery 40 may be provided with the heat dissipation structure 1a.

INDUSTRIAL APPLICABILITY

The heat conduction member according to the present invention can be utilized for, for example, various electronic devices such as automobiles, industrial robots, power generators, PCs, household electric appliances in addition to batteries for automobiles. The battery according to the present invention can be utilized as those to be used in electronic devices such as household batteries capable of charging-discharging, and PCs in addition to those for automobiles.

The invention claimed is:

1. A heat dissipation structure comprising a plurality of heat dissipating members for enhancing heat dissipation from a heat source, and a support plate for supporting the heat dissipating members, wherein each of the heat dissipating members comprises
   a plurality of cushion members each having a hollow or a solid shape, and
   a heat conduction sheet for conducting heat from the heat source, the sheet covering an outer surface of the cushion members,
   the support plate comprises a plurality of grooves for supporting the heat dissipating members in a direction orthogonal to a longitudinal direction of the heat dissipating members, and
   each of the grooves is a curved recess portion formed in a thickness direction, opened to the side of the heat dissipating member, formed to have a radius of curvature larger than a radius of curvature of the heat dissipating member, and to have a depth smaller than a circular conversion diameter of the heat dissipating member.

2. The heat dissipation structure of claim 1, wherein the support plate comprises at least one or more flow passages for passage of a cooling medium in the longitudinal direction.

3. The heat dissipation structure of claim 2, wherein the flow passage is a through passage penetrating through the support plate.

4. The heat dissipation structure of claim 1, wherein the support plate is a metal plate-like member.

5. The heat dissipation structure of claim 1, wherein the heat dissipating member is a cylindrical member having a hollow portion extending along the longitudinal direction.

6. The heat dissipation structure of claim 5, wherein each of the cushion members is a cylindrically shaped cushion member comprising the hollow portion extending along the longitudinal direction, and
   the heat conduction sheet is spirally wound around the outer surface of the cylindrically shaped cushion member.

7. The heat dissipation structure of claim 5, wherein the heat conduction sheet and the cushion members are integral and formed to advance spirally in one direction.

8. The heat dissipation structure of claim 1, wherein a heat conduction oil is applied to a surface of the heat conduction sheet for enhancing heat conductivity to the surface from the heat source in contact with the surface.

9. The heat dissipation structure of claim 8, wherein the heat conduction oil includes a silicone oil, and a heat conduction filler that exhibits higher heat conductivity than the silicone oil and contains at least one of metal, ceramics, and carbon.

10. A battery comprising one or more battery cells each as a heat source in a housing, wherein the heat dissipation structure of claim 1 is disposed between the battery cell and the housing.

\* \* \* \* \*